(12) United States Patent
Sun et al.

(10) Patent No.: US 7,799,740 B2
(45) Date of Patent: Sep. 21, 2010

(54) SYSTEMS AND METHODS FOR MONITORING AND CONTROLLING COMBINATORIAL PROCESSES

(75) Inventors: Zhi-Wen Sun, San Jose, CA (US); Tony Chiang, Campbell, CA (US)

(73) Assignee: Intermolecular, Inc., San Jose, CA (US)

( * ) Notice: Subject to any disclaimer, the term of this patent is extended or adjusted under 35 U.S.C. 154(b) by 0 days.

(21) Appl. No.: 12/041,540

(22) Filed: Mar. 3, 2008

(65) Prior Publication Data

US 2009/0163383 A1    Jun. 25, 2009

Related U.S. Application Data

(60) Provisional application No. 61/016,403, filed on Dec. 21, 2007.

(51) Int. Cl.
*C40B 50/08* (2006.01)
(52) U.S. Cl. ............... 506/27; 702/25; 702/30
(58) Field of Classification Search ............ 702/25, 702/30; 506/27
See application file for complete search history.

(56) References Cited

U.S. PATENT DOCUMENTS

| | | | |
|---|---|---|---|
| 4,326,940 A * | 4/1982 | Eckles et al. | 204/232 |
| 7,247,346 B1 * | 7/2007 | Sager et al. | 427/162 |
| 2002/0143474 A1 * | 10/2002 | Spitz MacDonald et al. | 702/25 |
| 2007/0225186 A1 * | 9/2007 | Fisher | 510/175 |
| 2009/0124081 A1 * | 5/2009 | Duong et al. | 438/678 |

* cited by examiner

*Primary Examiner*—Zandra Smith
*Assistant Examiner*—Jamie Niesz

(57) ABSTRACT

Method for monitoring and controlling a combinatorial process are presenting including: receiving a substrate; executing the combinatorial process, wherein the combinatorial process includes an in-line chemical preparation; analyzing the in-line chemical preparation for conformance with a corresponding in-line chemical preparation parameter using an in-line chemical analysis; and if the in-line chemical preparation is out of conformance with the corresponding in-line chemical preparation parameter, adjusting the in-line chemical preparation to conform with the corresponding in-line chemical preparation parameter utilizing a replenishing chemical preparation. In some embodiments, methods further include: performing a post-chemical mechanical planarization (CMP) clean before executing the combinatorial process, wherein the combinatorial process is a pre-clean; and depositing a capping layer after the pre-clean.

11 Claims, 8 Drawing Sheets

SYSTEMS AND METHODS FOR MONITORING AND CONTROLLING COMBINATORIAL PROCESSES

PRIORITY CLAIM TO PROVISIONAL APPLICATION

A claim for priority is hereby made under the provisions of 35 U.S.C. §119 for the present application based upon U.S. Provisional Application No. 61/016,403, filed on Dec. 21, 2007, which is incorporated herein by reference.

BACKGROUND

The semiconductor industry is under continual pressure to shrink features sizes so that processing power may be packaged into increasingly smaller dimensions. Because of the minute dimensions required in the fabrication of semiconductor devices, exacting control of processes used to manufacture semiconductor devices may be desirable in order to achieve acceptable and reproducible results. Measures for maintaining process integrity may include: utilizing ultra-clean environments, creating ultra-pure chemical process agents, and strictly controlling ambient conditions. In utilizing these measures, process steps may be more strictly controlled. One particular process step conventionally utilized for semiconductor fabrication is one or more pre-cleaning or cleaning operations performed on a substrate.

For example, a pre-cleaning operation may be utilized to prepare a substrate for a capping process. As may be appreciated, capping processes form a capping layer that significantly reduce electromigration associated with copper lines. In addition, capping layers may reduce an effective dielectric constant of copper/low-k dielectric interconnect structure. In a capping process, a pre-cleaning step may be utilized to remove organic and inorganic contamination on wafer surfaces while minimizing corrosion of the copper lines. Conventional pre-cleaning processes typically utilize commercially available cleaning solutions that may include organic acids, alkyl-alcohol amines, and anti-oxidants. These solutions may be pH adjusted in accordance with desired chemical reactivity for a particular substrate or process.

In a cleaning (e.g. a pre- or post-clean) process step, solutions may be applied to a substrate in any number of manners such as, for example, a solution bath. Controlling the chemical composition of a cleaning solution bath within an optimized concentration range or process window is critical to ensure reproducible results and optimal process performance. However, in some conventional systems utilizing commercially available chemistries, semiconductor manufacturers often rely solely on the purity and the concentration of the originally acquired cleaning solutions, which may not always provide for optimal results. Thus, systems and method for monitoring and controlling combinatorial processes are presented herein.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

The present invention will now be described in detail with reference to a few embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figure 1:
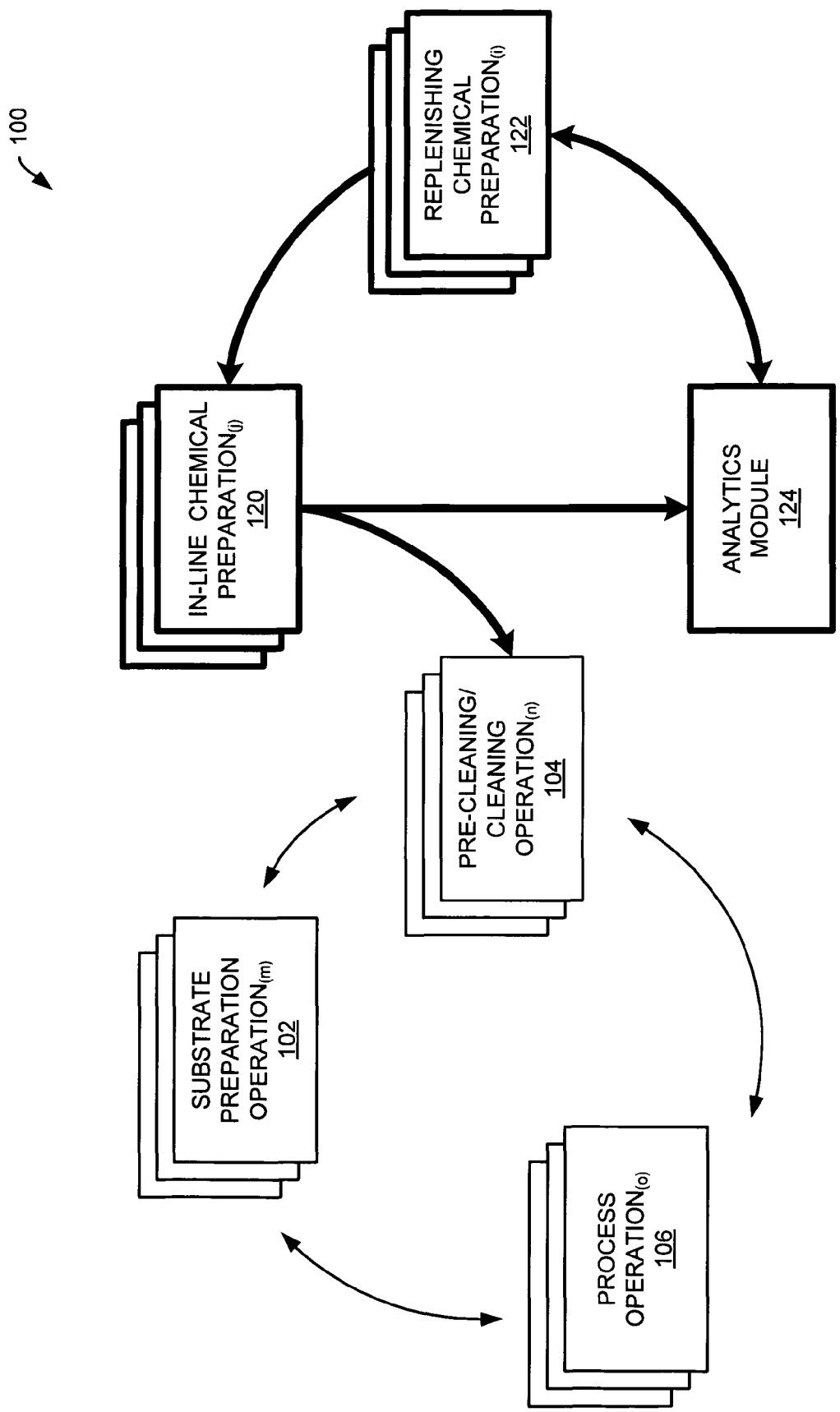
FIG. 1 is an illustrative representation of a system for monitoring and controlling combinatorial processes in accordance with embodiments of the present invention.

FIG. 1 is an illustrative representation of a system 100 for monitoring and controlling combinatorial processes in accordance with embodiments of the present invention. As noted above, it may be desirable to more precisely control process chemistries during processing steps. Typically, a manufacturer may utilize commercially available solutions for process steps. However, during processing, components of these solutions may fall below acceptable concentration ranges. To accommodate changes in concentration of the various components, solutions may be periodically flushed and replaced with new solutions. These simple measures, while effective, may raise manufacturing costs prohibitively. Systems provided herein may be utilized to more effectively replenish process chemistries. Utilizing embodiments herein, in-line chemical preparation 120 may be utilized to provide solutions for a pre-cleaning, post-cleaning (e.g., a post-CMP clean), or other cleaning operation 104. Cleaning operation 104 may be coupled with a process operation 106 and a substrate preparation operation 102. These operations may continue any number of times before a substrate is finished being processed.

In order to preserve process integrity, in-line chemical preparation 102 may be analyzed before processing and during processing by analytics module 124. If in-line chemical preparation is out of conformance with desired parameters, replenishing chemical preparation 122 may be utilized to bring in-line chemical preparation 120 into conformance.

Analytics module 124 may include any number of methods used separately or in combination to determine whether in-line chemical preparations or replenishing chemical preparations are in conformance with desired parameters without departing from the invention. For example, in embodiments, analytics may include: a combination high-performance liquid chromatography (HPLC) separation and ultraviolet (UV) spectroscopy analysis, a visible spectroscopy analysis, an acid-base titration analysis, and a combination of solution pH and electrical conductance analysis. Specific analytics will be discussed in further detail below for FIGS. 4-10.

Figure 2:
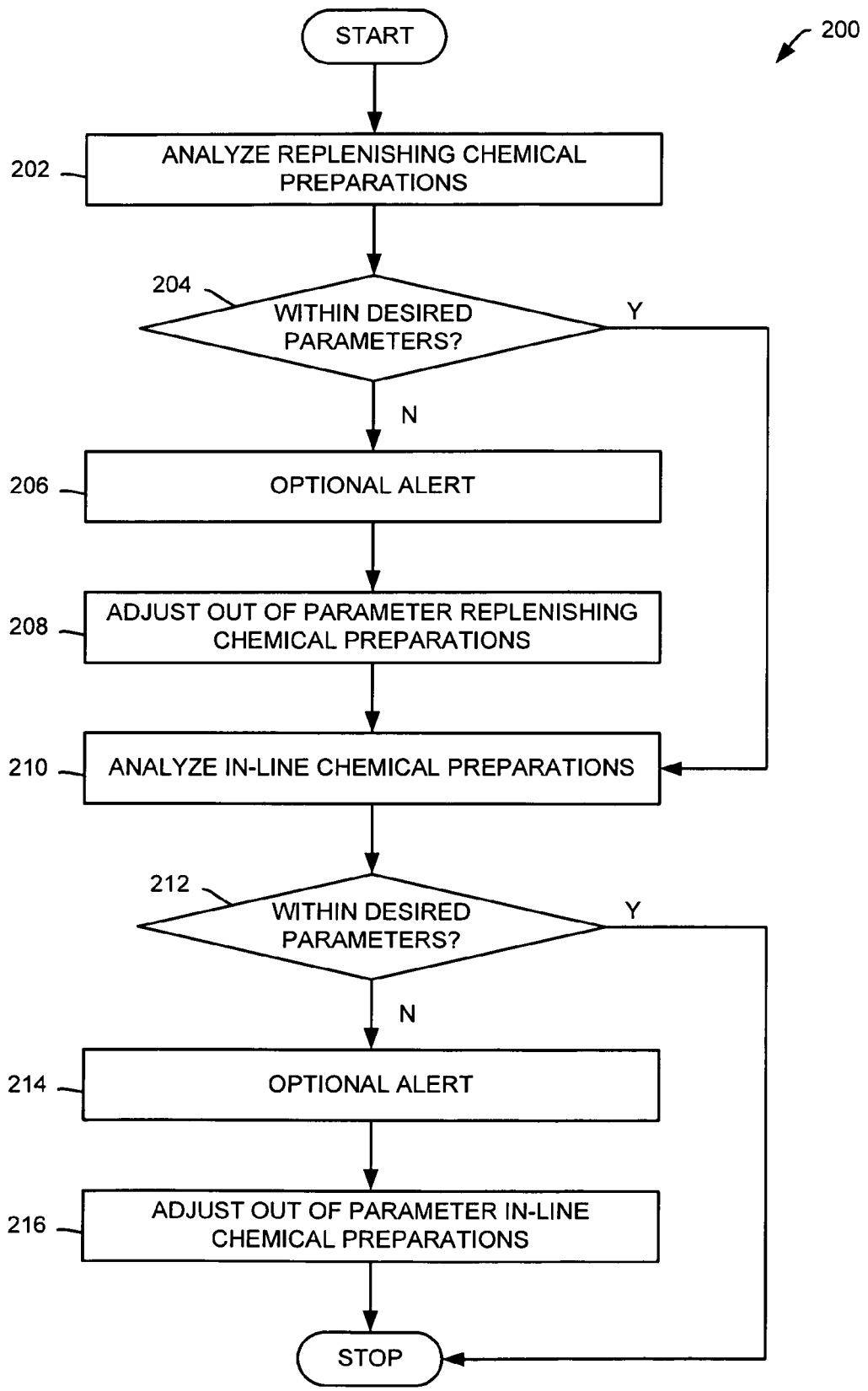
FIG. 2 is an illustrative flowchart for monitoring and controlling process chemistries before a process step in accordance with embodiments of the present invention.

FIG. 2 is an illustrative flowchart 200 for monitoring and controlling process chemistries before a process step in accordance with embodiments of the present invention. In particular, methods illustrated monitor and control replenishing chemical preparations and in-line chemical preparations in accordance with embodiments described here. At a first step 202, the method analyzes replenishing chemical preparations. In embodiments, replenishing chemical preparations may be utilized to replenish in-line chemical preparation before, during, or after processing steps. Methods of analyzing replenishing chemical preparations utilizing specific analytics will be discussed in further detail below for FIGS. 4-10. At a next step 204, the method determines whether the replenishing chemical preparation is within replenishing chemical preparation parameters. If the method determines at a step 204 that the replenishing chemical preparation is within replenishing chemical preparation parameters, the method continues to a step 210.

If the method determines at a step 204 that the replenishing chemical preparation is not within replenishing chemical preparation parameters, the method continues to a step 206 to provide an optional alert. Chemical preparation parameters may include, in some embodiments, global parameters such as: pH parameters, electrical conductivity parameters, color parameters, and solution density parameters. In addition, concentration parameters of individual components may be utilized in some embodiments. The method may provide any number of optional alerts well-known in the art without departing from the present invention. For example, in some embodiments alerts may include: a message alert, an audible alert, a visual alert or any combination thereof. At a next step 208, the method adjusts the replenishing chemical preparation to within replenishing chemical preparation parameters. Adjusting the replenishing chemical preparation may include adding additional solutions, removing solutions, flushing solutions, or any combination thereof without departing from the present invention. Thus, for example, in some embodiments, manually adjusting replenishing chemical preparations in the absence of an automatic close-loop control may be accomplished using volumetric cylinders and pipettes. In other embodiments, automatically adjusting replenishing chemical preparations utilizing a close-loop control may be accomplished using software control of syringes connected with separate chemical component supplies and drain tanks.

At a next step 210, the method analyzes in-line chemical preparations. Methods of analyzing in-line chemical preparations utilizing specific analytics will be discussed in further detail below for FIGS. 4-10. At a next step 212, the method determines whether the in-line chemical preparation is within in-line chemical preparation parameters. Chemical preparation parameters may include, in some embodiments, global parameters such as: pH parameters, electrical conductivity parameters, color parameters, and solution density parameters. In addition, concentration parameters of individual components may be utilized in some embodiments. If the method determines at a step 212 that the in-line chemical preparation is within in-line chemical preparation parameters, the method ends. If the method determines at a step 212 that the in-line chemical preparation is not within in-line chemical preparation parameters, the method continues to a step 214 to provide an optional alert. The method may provide any number of optional alerts well-known in the art without departing from the present invention. For example, in some embodiments alerts may include: a message alert, an audible alert, a visual alert or any combination thereof. At a next step 216, the method adjusts the in-line chemical preparation to within in-line chemical preparation parameters. Adjusting the in-line chemical preparation may include adding additional solutions from the replenishing chemical preparations, removing solutions, flushing solutions, or any combination thereof without departing from the present invention. Thus, for example, in some embodiments, manually adjusting replenishing chemical preparations in the absence of an automatic close-loop control may be accomplished using volumetric cylinders and pipettes. In other embodiments, automatically adjusting replenishing chemical preparations utilizing a close-loop control may be accomplished using software control of syringes connected with separate chemical component supplies and drain tanks.

In some embodiments, an in-line chemical preparation is an aqueous solution that includes: an alkyl-alcohol-amine portion having a concentration in the range of approximately 0.05 to 2.0 M; an ascorbic acid portion having a concentration in the range of approximately 0.03 to 0.30 M; and a tetramethylammonium hydroxide (TMAH) portion having a concentration in the range of approximately 0.05 to 1.5 M. This example in-line chemical preparation may be particularly useful for pre-cleaning (or cleaning) steps utilized in coordination with a capping process. As noted above, capping processes form a capping layer that significantly reduces electromigration associated with copper lines. In some embodiments, cobalt based capping processes or a nickel based capping processes may be utilized without limitation. As such, a cobalt capping layer, a cobalt alloy capping layer, a nickel capping layer, and a nickel alloy capping layer may be provided in some embodiments. In other embodiments, noble metal capping processes may be utilized. As such, a ruthenium capping layer, a platinum capping layer, an iridium capping layer, a rhodium capping layer, a rhenium capping layer, and their alloys may be provided in some embodiments. In still other embodiments, organic capping processes may be utilized. As such, various thiol capping layers, and mercapto-based silane capping layers may be provided in some embodiments. Other cleaning operations, such as post-CMP cleans may use the disclosed embodiments to monitor and adjust cleaning baths. In general, any wet process that may require in-process adjustment can be adjusted using the techniques described herein.

It may be appreciated that some embodiments described above may occur upon a pre-determined triggering event. For example, a triggering event may be a periodic time interval so that analyzing occurs at a pre-determined interval. In another example, a triggering event may occur at a process step as, for example, when extremely accurate chemical preparations are required for a particular process step. In still another example, a triggering event may be random so as to maximize analyzing efficiency. Any number of triggering events may be utilized without departing from the present invention.

Figure 3:
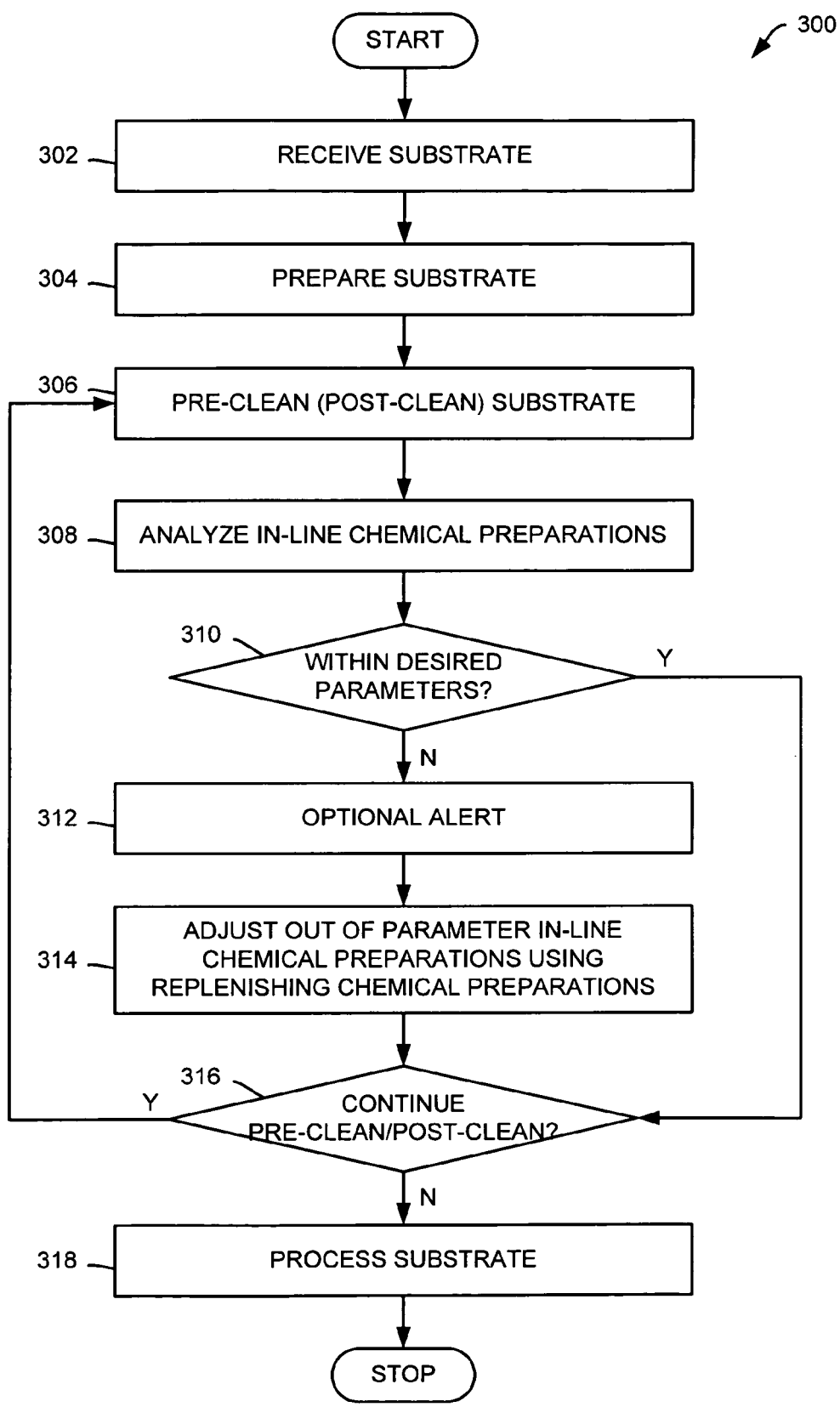
FIG. 3 is an illustrative flowchart for monitoring and controlling process chemistries during a process step in accordance with embodiments of the present invention.

FIG. 3 is an illustrative flowchart 300 for monitoring and controlling process chemistries during a process step in accordance with embodiments of the present invention. At a first step 302 the method receives a substrate. In embodiments, substrates may be received manually or automatically without limitation. At a next step 304, a substrate is prepared. It may be appreciated that substrates may require specific manufacturing parameters selected to enhance or impair specific reactions. For example, the temperature of a substrate may be lowered to discourage undesirable chemical reactions. Likewise, the temperature of a substrate may be raised to encourage desirable chemical reactions. Additionally, various other semiconductor processes may be performed during a preparation step. At a next step 306, the method continues to pre-clean (or clean) a substrate. Pre-cleaning processes may be utilized to remove organic and inorganic contamination and/or surface oxide films on wafer surfaces while minimizing corrosion of the conductive lines or other structures.

At a next step 308, the method analyzes in-line chemical preparations. Methods of analyzing in-line chemical preparations utilizing specific analytics will be discussed in further detail below for FIGS. 4-10. The analysis may initiate in response to a trigger, as described above. At a next step 310, the method determines whether the in-line chemical preparation is within in-line chemical preparation parameters. Chemical preparation parameters may include, in some embodiments, global parameters such as: pH parameters, electrical conductivity parameters, color parameters, and solution density parameters. In addition, concentration parameters of individual components may be utilized in some embodiments. If the method determines at a step 310 that the in-line chemical preparation is within in-line chemical preparation parameters, the method continues to a step 316. If the method determines at a step 310 that the in-line chemical preparation is not within in-line chemical preparation parameters, the method continues to a step 312 to provide an optional alert. The method may provide any number of optional alerts well-known in the art without departing from the present invention. For example, in some embodiments alerts may include: a message alert, an audible alert, a visual alert or any combination thereof. At a next step 314, the method adjusts the in-line chemical preparation to within in-line chemical preparation parameters. Adjusting the in-line chemical preparation may include adding additional solutions from the replenishing chemical preparations, removing solutions, flushing solutions, or any combination thereof without departing from the present invention. Thus, for example, in some embodiments, manually adjusting replenishing chemical preparations in the absence of an automatic close-loop control may be accomplished using volumetric cylinders and pipettes. In other embodiments, automatically adjusting replenishing chemical preparations utilizing a close-loop control may be accomplished using software control of syringes connected with separate chemical component supplies and drain tanks.

At a next step 316, the method determines whether to continue a pre-clean. If the method determines at a step 316 to continue the pre-clean, the method continues to a step 306 to continue the pre-clean. If the method determines at a step 316 not to continue the pre-clean, the method continues to a step 318 to process a substrate. As noted above, at least one type of process suited for embodiments described herein is a capping process. Capping processes form a capping layer that significantly reduces electromigration associated with copper lines. In some embodiments, cobalt based capping processes or a nickel based capping processes may be utilized without limitation. As such, a cobalt capping layer, a cobalt alloy capping layer, a nickel capping layer, and a nickel alloy capping layer may be provided in some embodiments. In other embodiments, noble metal capping processes may be utilized. As such, a ruthenium capping layer, a platinum capping layer, an iridium capping layer, a rhodium capping layer, a rhenium capping layer, and their alloys may be provided in some embodiments. In still other embodiments, organic capping processes may be utilized. As such, various thiol capping layers, and mercapto-based silane capping layers may be provided in some embodiments.

As noted above, in some embodiments, an in-line chemical preparation is an aqueous solution that includes: an alkyl-alcohol-amine portion having a concentration in the range of approximately 0.05 to 2.0 M; an ascorbic acid portion having a concentration in the range of approximately 0.03 to 0.30 M; and a tetramethylammonium hydroxide (TMAH) portion having a concentration in the range of approximately 0.05 to 1.5 M. This example in-line chemical preparation may be particularly useful for pre-cleaning steps utilized in coordination with a capping process.

It may be appreciated that some embodiments described above may occur upon a pre-determined triggering event. For example, a triggering event may be a periodic time interval so that analyzing occurs at a pre-determined interval. In another example, a triggering event may occur at a process step as, for example, when extremely accurate chemical preparations are required for a particular process step. In still another example, a triggering event may be random so as to maximize analyzing efficiency. Any number of triggering events may be utilized without departing from the present invention.

Analytics Module

As noted above for FIG. 1, analytics module 124 may include any number of methods used separately or in combination to determine whether in-line chemical preparations or replenishing chemical preparations are in conformance with desired parameters without departing from the invention. For example, in embodiments, analytics may include: a combination high-performance liquid chromatography (HPLC) separation and ultraviolet (UV) spectroscopy analysis, a visible spectroscopy analysis, a combination solution pH and electrical conductance analysis, and an acid-base titration analysis.

HPLC Separation and UV Spectroscopy Analysis

In some embodiments, HPLC separation in coordination with UV spectroscopy may be utilized to analyze organic acids such as ascorbic acid. In some embodiments, HPLC separation in coordination with UV spectroscopy may be utilized to analyze alkyl-alcohol amines. As noted above, ascorbic acid may be utilized in an in-line chemical preparation and a replenishing chemical preparation. In addition, acid decomposition status may also be analyzed with a UV detector when UV absorption peaks for the acid and its decomposition products differ. Thus, UV spectroscopy may be particularly suited for analyzing acids such as ascorbic acid as contemplated herein.

In general, organic acids containing one or more double bonds can be readily analyzed by UV spectroscopy in the wavelength range of 200-400 nm. The decomposition products of these organic acids can also be analyzed by UV spectroscopy when they have different absorption peak positions from the original chemical. Furthermore, existing HPLC instruments with appropriate standard separation columns can be easily adopted to analyze organic acids present in aqueous alkaline cleaning solutions.

One example of UV spectroscopy following HPLC separation is for ascorbic acid. In this example, the UV absorption peak for the original ascorbic acid is approximately 240 nm, and the peak for its decomposition product in alkaline solution is approximately 265 nm. The chemical information on ascorbic acid concentration and its decomposition rate can be obtained by monitoring the UV absorption intensity at both 240 nm and 265 nm, as well as the peak intensity change with bath aging. In addition, where only one chemical component shows prominent UV absorption, simple UV spectroscopy without the use of HPLC can be used to achieve the same results as outlined above.

Visible Spectroscopy

In some embodiments, visible spectroscopy may be utilized to probe the degree of chemical decomposition of the components when the decomposition products show visible absorption or coloring, such as the decomposition products for ascorbic acid.

In an example where one or more chemical components or their decomposition products exhibit characteristic coloring in the visible light range, visible spectroscopy with proper calibration may be used to analyze the chemical concentrations of the components and the decomposition products in solution. In addition, the relative rates of chemical decomposition may also be evaluated without any calibration if an initial fresh solution is colorless. For example, an original fresh ascorbic acid solution is colorless; in addition, a fresh cleaning solution is also colorless. However, ascorbic acid solutions and cleaning solutions both gradually become yellow to golden yellow colored as decomposition products increase. The rate of color change depends on an initial ascorbic acid concentration and solution pH. Rate changes for these solutions are also sensitive to light illumination, the presence of air above the solution, and the amount of dissolved oxygen in the solution. Thus, color change may represent an indicator of ascorbic acid decomposition. In an embodiment, ascorbic acid decomposition status may thus be determined by monitoring the change in the visible absorption intensity with cleaning solution bath aging in the wavelength range of 390-560 nm.

Solution pH and Electrical Conductance Analysis

In some embodiments, solution pH and electrical conductance analysis may be utilized to probe key component concentrations and the corresponding decomposition status under proper calibration of the system. For example, typically, solution pH measurement is a routine quality check that must be done to determine whether any gross problems exist for a cleaning solution. Corrective actions must be taken if a measured pH value is outside a process pH parameter range. A solution electrical conductance measurement may also be utilized in conjunction with a solution pH measurement, which measurements may then serve as a cleaning solution quality check.

Figure 4:
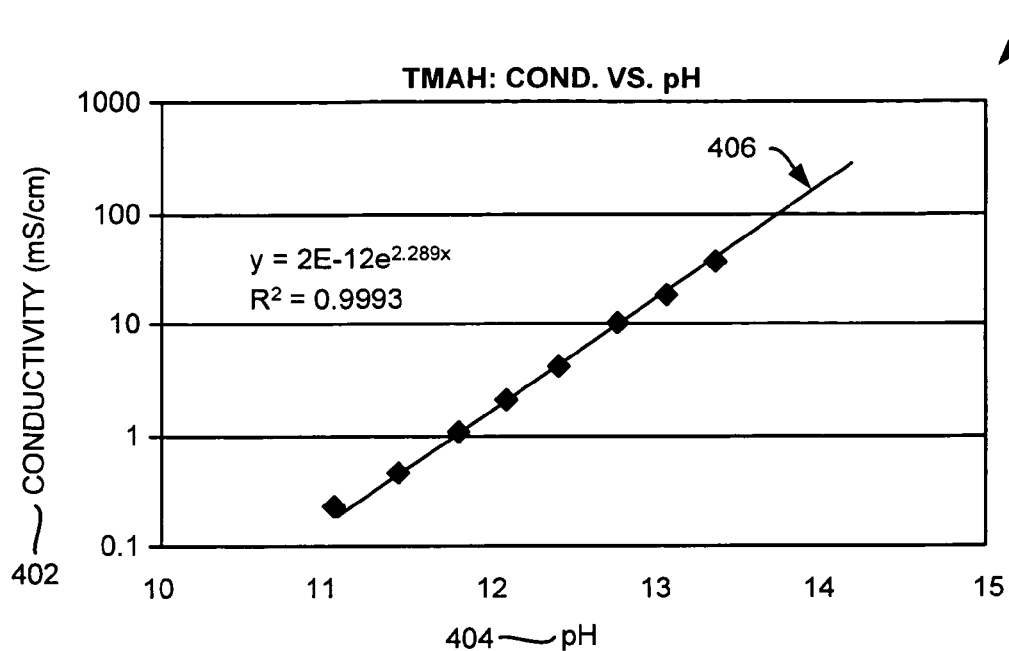
FIG. 4 is an illustrative graphical representation of electrical conductance of TMAH as a function of pH in accordance with embodiments of the present invention.

As noted above, in embodiments, a combination of pH measurement and electrical conductance measurement may be utilized to estimate a concentration of some of the key components in a solution and their corresponding decomposition products. Estimates may be made utilizing appropriate calibration curves. For example, in some embodiments, for a cleaning solution having an alkyl-alcohol-amine portion, an ascorbic acid portion, and a TMAH portion where the pH is approximately greater than 11, alkyl-alcohol-amines such as ethanolamine exist primarily as neutral molecules that do not contribute to electrical conduction. Any electrical conductance is provided by the various forms of charged anions of ascorbic acid and the ions attributable to the dissociation of TMAH in water. The contribution of ions from TMAH dissociation in wide pH ranges may be determined from monitoring the electrical conductance of TMAH as shown in FIG. 4, which is an illustrative graphical representation 400 of electrical conductance of TMAH 402 as a function of pH 404 in accordance with embodiments of the present invention. A calibration curve 406 may then be plotted. The contribution of ions from ascorbic acid can then be obtained by subtracting the TMAH contribution (as illustrated) from the total measured cleaning solution electrical conductance at the measured cleaning solution pH. The change of ascorbic acid conductance with bath aging for a pH maintained bath can then serve as an indication for ascorbic acid decomposition.

Acid-Vase Titration Analysis

Acid-base titration analysis of dilute cleaning solutions, combined with proper calibration curves for the individual components and known combinations, may be utilized to analyze the chemical concentration of all the acids and bases in the solution from a single titration curve. The single titration curve may also be utilized to provide key component decomposition status at the same time. In order to determine acid and base concentrations of individual components from a single titration curve on a multi-component cleaning solution, maximum information must be extracted from the titration curve. Conventional practices for acid-base titration that consist of obtaining analyte concentrations solely from an equivalence point may be insufficient.

Equivalence point refers to the point in the titration curve where the amount of added acid (or base) expressed in Normality (N) is the same as that for the base (or acid) being titrated:

$$N_{analyte} = N_{titrant} \text{ at equivalence point}$$

In a titration curve, the equivalence point is usually at the center point of the region with the fastest changing slope. Additional information such as the width of pH buffer zone, defined as the portion of the titration curve exhibiting curve slopes below certain critically specified values within specified pH ranges, may also be analyzed. Furthermore, calibration curves such as standard titration curves for the individual components and known binary combinations may be utilized as references for some endpoint detection. Examples are provided for embodiments having cleaning solution as noted above to illustrate the above noted principles.

Figure 5:
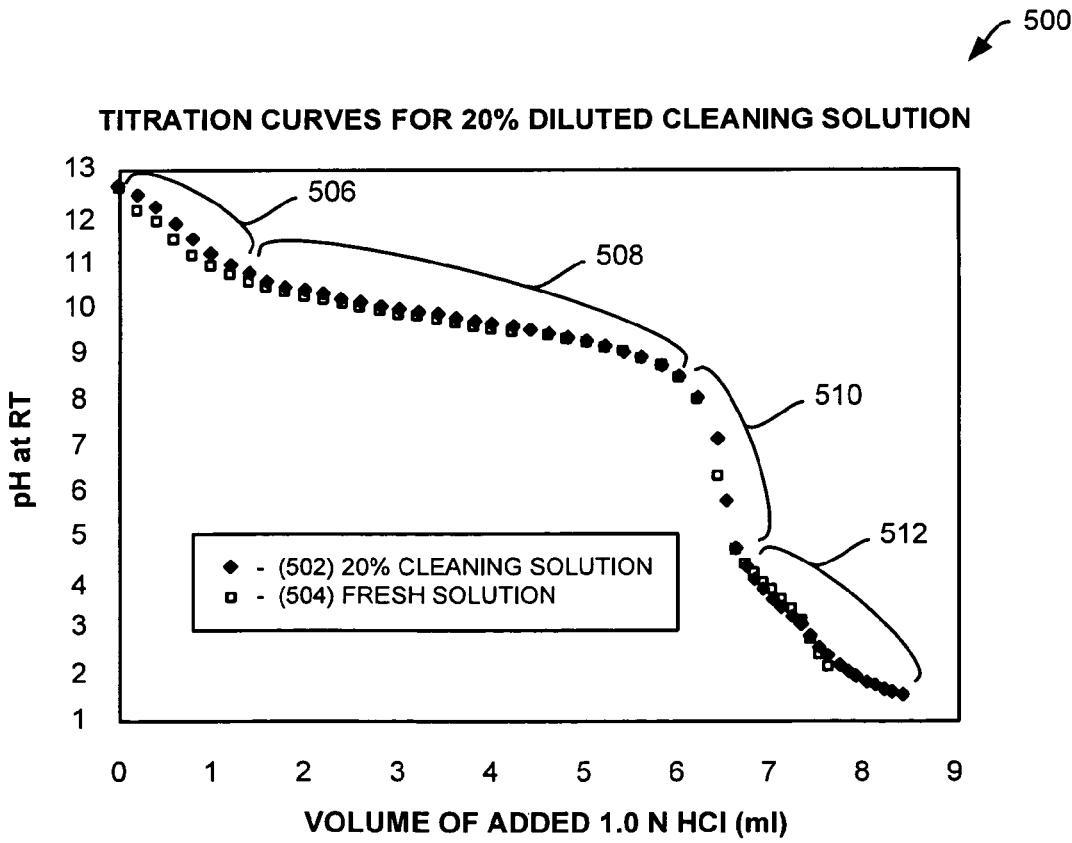
FIG. 5 is an illustrative titration curve for cleaning solutions in accordance with embodiments of the present invention.

FIG. 5 is an illustrative titration curve for cleaning solutions in accordance with embodiments of the present invention. More particularly, FIG. 5 is an illustrative titration curve of a 20 ml sample of 20% diluted commercial wafer cleaning solution containing ethanolamine, ascorbic acid, and TMAH where all solution concentrations are unknown. The illustrated titration was performed using a titrant of 1.0 N hydrochloric (HCl) acid solution. HCl acid solution was added in increments of 0.1 or 0.2 ml. After each addition, the solution was well-mixed by stirring. After mixing the pH of the titrated solution was measured using a pH meter with an accuracy of +/-0.03 at approximately room temperature. The titration curve plots the solution pH against the total volume of the titrant. At least four distinct regions may be seen for the illustrated titration curve. A first region 506 is defined by a fast pH drop region at the initial stage of the titration. A second region 508 is defined by a slow pH change region around pH 9.8. This second region is also called the pH buffer zone. A third region 510 is defined by a sharp pH drop region over a very narrow addition volume range. In this region, the equivalence point, which is often defined as the pH value at which the highest slope is obtained, is located. A fourth region 512 is defined by the relatively sloppy tail following the third region.

Close examination of the acid-base equilibrium of the individual components from standard chemistry handbook such as Merck Index shows the following relationships:

$$HEA^+ + OH^- = EA + H_2O \quad pKa = 9.5$$

$$H_2A = HA^- + H^+ \quad pKa_1 = 4.2$$

$$HA^- = A^{2-} + H^+ \quad pKa_2 = 11.6$$

As may be appreciated, TMAH dissociates almost fully into $TMA^+$ and $OH^-$, so the normal titration equivalence point is located at pH 7.0 for TMAH alone.

In the above chemical equilibrium expressions:

EA represents the neutral ethanolamine molecule;

$HEA^+$ represents the protonated cation form of ethanolamine;

$H_2A$ represents the neutral ascorbic acid molecule;

$HA^-$ represents the 1st dissociation product of ascorbic acid;

$A^{2-}$ represents the 2nd dissociation product of ascorbic acid; and $H^+$ and $OH^-$ represent the hydrated hydrogen ion and hydroxide ion, respectively.

The pKa represents the negative value of the logarithm of the acid-base equilibrium constant.

The acid-base equilibrium shifts with changing pH, therefore the actual distribution or concentration of the chemical species in the solution changes according to solution pH values. As a general rule, at pH<pKa−1, species at the left side of the equilibrium dominates, at pH>pKa+1, species at the right side of the equilibrium dominates. Additionally, where pH is in the range of pKa+/−1, species at both sides of the equilibrium coexist, and pH buffer is then observed. The dependence of the concentration of the chemical species on pH due to acid-base equilibrium and due to the well-separated pKa values of the above co-existing equilibrium equations make it possible to use one acid-base titration to determine individual acid and base concentrations in multi-component wet chemical solutions from a single titration curve.

Equipped with the above fundamental knowledge of acid-base titration, a detailed analysis of the titration curve yields the following information. First region 506 is defined by a pH drop at approximately pH 9.8. In this first region, the HCl acid solution primarily titrates $OH^-$ dissociated from TMAH, and $A^{2-}$ dissociated from ascorbic acid. It may be noted that this first region actually ended before all $A^{2-}$ was converted to $HA^-$ (at pH<10.6) and before pH 7.0, so the region cannot be utilized to determine either ascorbic acid or TMAH concentration.

In second region 508 (i.e. pH buffer zone) at approximately pH=9.8, any buffer action is solely provided by the acid-base equilibrium between $HEA^+$ and EA with pKa=9.5. Without being bound by theory, careful data analysis within the pH buffer zone based on the acid-base equilibrium suggests that the width of the buffer zone may be utilized as a basis of quantitative chemical analysis for determining the corresponding acid/base concentrations with satisfactory accuracy for industrial applications. Since the approach of using the width of pH buffer zone as the basis of quantitative chemical analysis has never been established before, a set of calibration curves, or titration curves with various known EA concentrations, must first be established, whereupon criteria for the pH buffer zone may then be defined. It may be appreciated that the above principles may be applied to determine concentrations of weak acids and weak bases exhibiting an acid/base equilibrium in solution. Thus, embodiments may be utilized to determine concentrations of weak acids such as succinic acid, acetic acid, uric acid, glycolic acid, EDTA; and concentrations of weak bases such as ethylenediamine and glycine.

Figure 6:
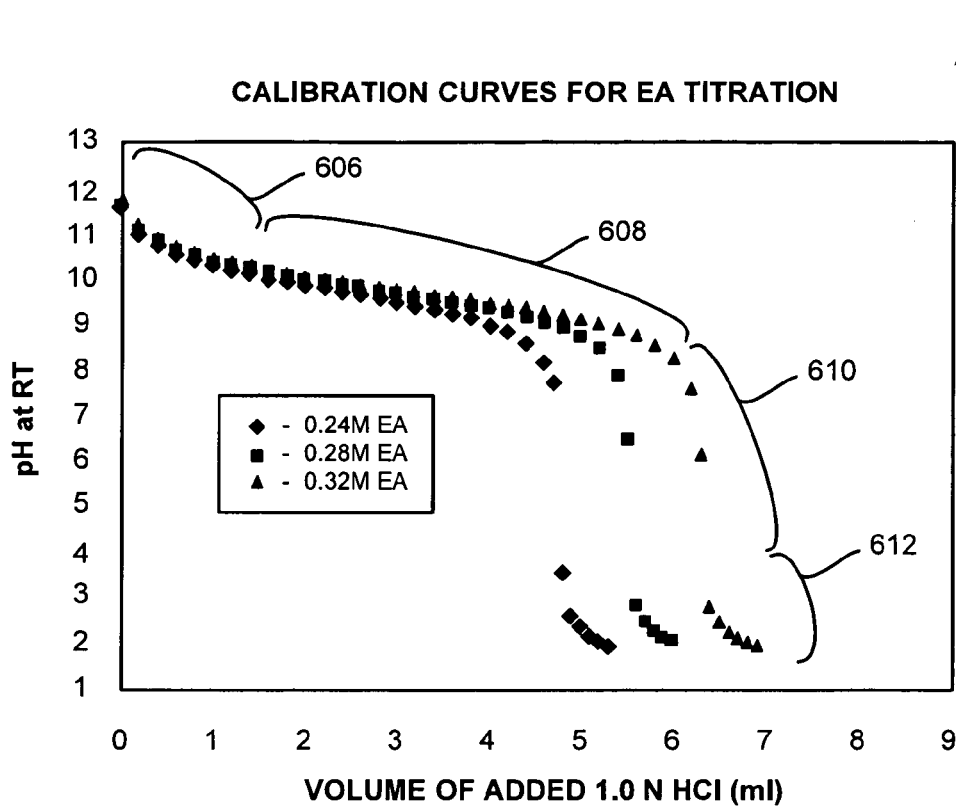
FIG. 6 is an illustrative representation of calibration curves for three known EA concentrations in accordance with embodiments of the present invention.
Figure 7:
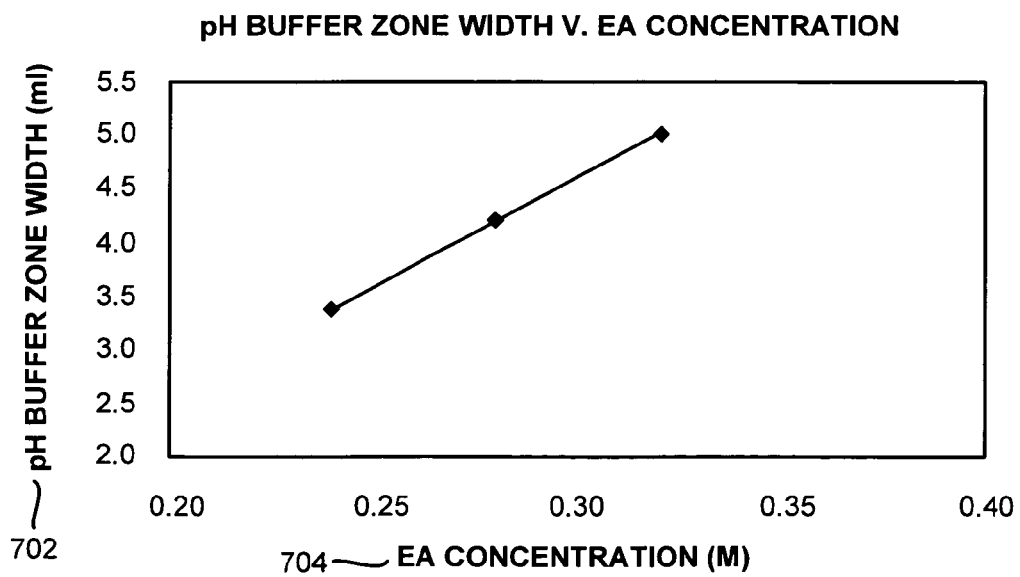
FIG. 7 is an illustrative graphical representation of a pH buffer zone as a function of EA concentration in accordance with embodiments of the present invention.
Figure 8:
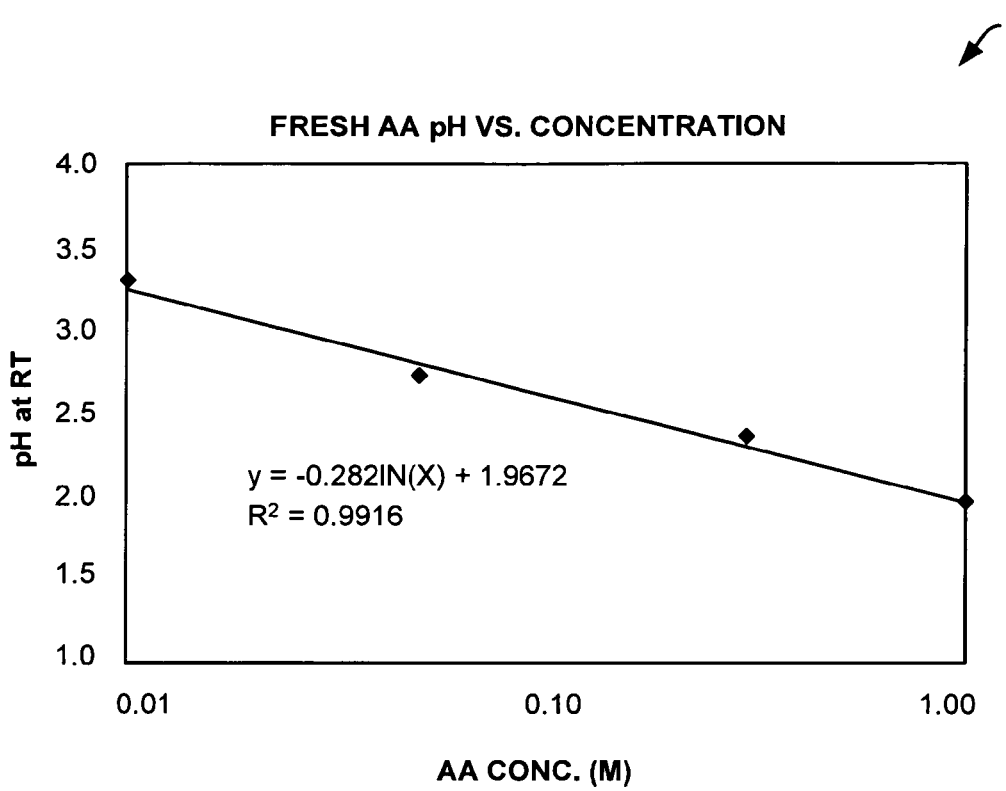
FIG. 8 is an illustrative graphical internal reference curve for ascorbic acid pH as a function of concentration in accordance with embodiments of the present invention.

FIG. 6 is an illustrative representation 600 of calibration curves for three known EA concentrations in accordance with embodiments of the present invention. If it is assumed that within the pH buffer zone the slope of the titration curve must be within 2× of the minimum slope, a linear dependence of the width of the pH buffer zone on EA concentration may be established, as illustrated in FIG. 7, which is an illustrative graphical representation 700 of a pH buffer zone 702 as a function of EA concentration 704 in accordance with embodiments of the present invention. Such linear dependence is in fact expected for a relatively narrow acid/base concentration range which may be selected around any desired concentration level. Applying the above established relationship between the width of the pH buffer zone and the original acid/base concentration, an EA concentration in a cleaning solution may then be determined. The sensitivity and the accuracy of the analysis can be ensured by proper choices of the initial acid/base concentrations and the titrant concentration and addition increment. With 20 ml of 20% diluted cleaning solution utilized as example here, 0.1 to 0.2 ml of 1.0N HCl addition increment is good enough to provide >95% accuracy, and >97% in most tested cases.

As noted above, a region having a very sharp pH drop following the pH buffer zone 608 is the commonly referred-to equivalence point zone 610. As such, the apparent total base concentration of the cleaning solution is then the number of moles of acid added at the equivalence point. Examining all the listed acid-base equilibrium, the amount of total apparent base should be the sum of all bases minus the portion that is utilized to neutralize $H^+$ corresponding to the original ascorbic acid concentration because ascorbic acid exits as $HA^-$ at a pH of approximately 7.0 and the released $H^+$ concentration is the same as the original ascorbic acid concentration.

The final sloppy tail region 612 following the sharp equivalence point zone 610 is the titration zone for titrating $HA^-$ into $H_2A$, or the ascorbic acid titration zone. This zone is the reverse titration curve for base titrating acid. That is, instead of starting the titration from low pH in acid, we start the titration from high pH back to low pH. The endpoint for normal base titrating acid is very sharp and easy to detect due to sharp pH change close to the equivalence point; however, due to the reverse titration for the tail region, the endpoint cannot be directly detected, the endpoint actually lies in the very low pH range where $HA^-$ is totally converted to $H_2A$. Had the ascorbic acid concentration been high enough, the method of using the width of the pH buffer zone to determine chemical concentration would have been possible. Realizing that solution pH is solely controlled by the $H_2A$ concentration at the end of the reverse ascorbic acid titration, an internal reference curve of pH as function of ascorbic acid concentration is established in order to decide the endpoint for the reverse ascorbic acid titration. A plot shown as FIG. 8, which is an illustrative graphical internal reference curve 800 for ascorbic acid pH as a function of concentration in accordance with embodiments of the present invention. Without being bound by theory, such reference curves should center on the desired ascorbic acid concentration.

The following scheme is developed to artificially decide the endpoint for the tail region for ascorbic acid titration. First, a rough estimate of the ascorbic acid concentration is made by assuming that the endpoint lies at the end of the sloppy tail before the slope actually flattens; and second, the internal reference curve at the estimated concentration range is examined to find the pH values and the slope of pH change around that concentration to determine that starting at what addition increment since the equivalence point (from the sharp pH drop region) the pH of the titrated solution is already dominated by $H_2A$. The starting point corresponding to the $H_2A$ region is then defined as the endpoint for the reverse ascorbic acid titration. This method gives >90-95% accuracy for ascorbic acid in the concentration range of 0.03-0.30 M in cleaning solutions containing various amounts of ethanolamine, TMAH, and ascorbic acid, no interference from TMAH and EA can be detected. Adding the mole amount of ascorbic acid determined from the above steps to the mole amount of the total apparent base concentration, and then subtracting the ethanolamine concentration determined from the width of pH buffer zone, the TMAH concentration in the cleaning solution is then obtained.

Referring briefly to FIG. 5, an embodiment of applicability of the present invention is presented. A fresh chemical solution was made with ethanolamine, ascorbic acid, and TMAH using the component concentrations determined for a 20 ml of 20% cleaning solution represented by titration curve 502 in FIG. 5 and for a freshly-made solution represented by titration curve 504 in FIG. 2. The excellent agreement of the two curves shows the power of the acid-base titration methods disclosed in this invention quite well.

Figure 9:
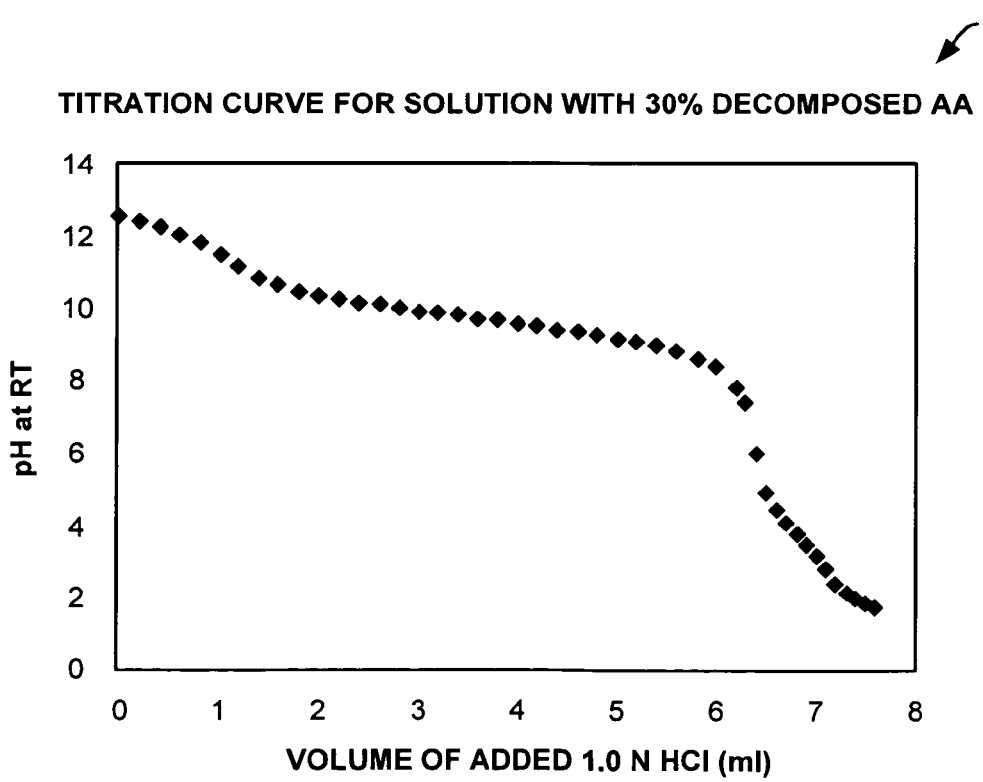
FIG. 9 is an illustrative titration curve of a cleaning solution having 30% decomposed ascorbic acid in accordance with embodiments of the present invention.

In addition, in some embodiments, an acid-base titration for ascorbic acid may also be utilized to determine an actual active ascorbic acid concentration in a cleaning solution containing partially decomposed ascorbic acid. FIG. 9 is an illustrative titration curve of a 20 ml cleaning solution having 30% decomposed ascorbic acid in accordance with embodiments of the present invention and gives an example of the cleaning solution made from ascorbic acid of known degree of decomposition. Notably, the analytical results may be utilized to determine a concentration of un-decomposed ascorbic acid. Therefore, the acid-base titration procedure disclosed here can also be utilized to accurately monitor the ascorbic acid decomposition rate in the cleaning solution bath during production of semiconductor chips.

Figure 10:
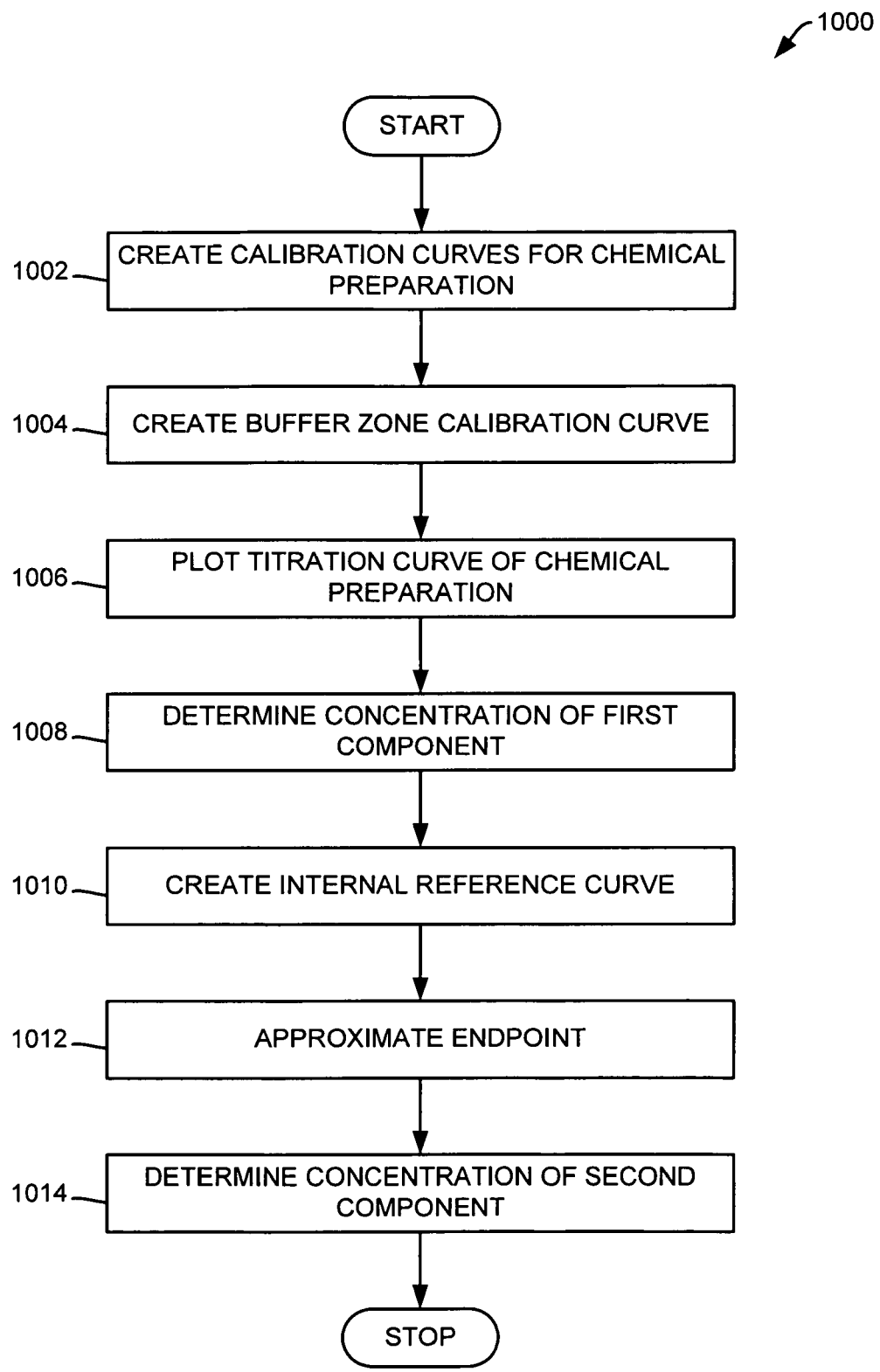
FIG. 10 is an illustrative flowchart of methods for performing an acid-base titration analysis in accordance with embodiments of the present invention.

FIG. 10 is an illustrative flowchart 1000 of methods for performing an acid-base titration analysis in accordance with embodiments of the present invention. FIG. 10 is provided for further clarifying the above discussion. As such, at a first step 1002, the method creates calibration curves of pH as a function of titration volume of a first component of chemical preparation. Notably, calibration curves represent selected concentrations of the first component of the chemical preparation. See FIG. 6 above for a discussion of calibration curves. At a next step 1004, the method creates a buffer zone calibration curve of a calibration pH buffer zone width as a function of the selected concentrations of the first component. The calibration pH buffer zone width is derived from the calibration curves created at a step 1002. See FIG. 7 above for a discussion of buffer zone calibration curves. At a next step 1006, the method plots a titration curve of the chemical preparation. The titration curve includes a plotted pH buffer zone width. See FIG. 5 above for a discussion of titration curves.

At a next step 1008, the method determines a concentration of the first component by comparing the plotted pH buffer zone width from the calibration curve with the calibration pH buffer zone width. At a next step 1010, the method creates an internal reference curve of pH as a function of concentration of a second component to determine an endpoint for a reverse acid titration. See FIG. 8 above for a discussion of internal reference curves. At a next step 1012, the method approximates the endpoint from a titration curve of the chemical preparation. As noted above, a titration curve includes a sloppy tail region. A slope may be determined from the titration curve. The approximate endpoint is located where the slope approaches zero. At a next step 1012, the method determines the concentration of a second component by finding the actual endpoint with the help of the internal reference curve, as described above. The method then ends.

Mathematical Method to Further Improve Analysis Accuracy

Calibration curves based on multi-points correlation may be utilized as an internal reference to further improve the analysis accuracy. Such an approach is common for many commercial chemical analyzers, and may be incorporated herein. The simplest internal calibration reference method is a three-point correlation curve. A three-point correlation curve consists of creating a series of standard solutions containing all analytes of interest at three different known levels. The correlation curves plot the measured quantity of any known analyte at all 3 levels against the known standard levels. The method continues to curve fit the measured values against the known values. The method then utilized the three-point correlation curve to further correct for the measured values and thus further improve the measurement accuracy.

Combinatorial Processing

Methods described herein may be particularly useful with combinatorial processes where rapid testing of various test environments may be desirable. Combinatorial processing includes any number of processing steps and conditions (e.g., semiconductor processing) that vary across one or more substrates. As used herein, a substrate may be, for example, a semiconductor wafer, a portion of a semiconductor wafer, solar photovoltaic circuitry, or other semiconductor substrate. The term "substrate" includes a coupon, which is a diced portion of a wafer, or any other device on which semiconductor processes are performed. The coupon or substrate may optionally contain one die, multiple dice (connected or not through the scribe), or portion of die with useable test structures. In some embodiments, multiple coupons, or die can be diced from a single wafer and processed combinatorially.

Combinatorial processing may be performed by processing a substrate and varying processing conditions across multiple substrates, multiple regions of a single substrate, or any combination thereof. Processing conditions may include, for example, chemical formulation, fluid flow rates, temperatures, reaction times, concentrations, agitation or stirring, process ordering, etc. Thus, for example, a first region of a substrate may be processed using a first process condition such as applying a first chemical (process) at a first temperature (condition). In addition, a second region of the substrate may be processed using a second process condition such as applying the first chemical (process) at a second temperature (condition). The measured characteristics of the processed regions may then be evaluated whereupon, one, both, or neither of the processes and corresponding conditions may be selected as suitable candidates for larger scale processing. Techniques for combinatorial processing are described in U.S. patent application Ser. No. 11/352,077, entitled "Methods For Discretized Processing and Process Sequence Integration of Regions of a Substrate," which is herein incorporated by reference.

Several combinatorial processing tools may be utilized solely or in combination when performing combinatorial processes. One type of combinatorial processing tool for semiconductor processing is a wet processing tool that utilizes a reactor block. A reactor block includes multiple openings which define individual reactors on a single substrate. Each of the openings may further include a sleeve that creates a seal with the substrate to contain and isolate processing fluids or chemicals within a single reactor. In some examples, this processing may be referred to as "site-isolated." For example, a reactor block may include 28 openings that define 28 regions on a substrate. As may be appreciated, in some examples of combinatorial processes, volumes of individual reactors are generally small. In some examples, typical volumes might be on the order of 2-20 ml. Because volumes tend to be small, in order to perform some embodiments of the present invention that include calibration curves, use of microtitrations may be required. Microtitration is a procedure for titrating substances in which small volumes are used, often 0.025 or 0.05 ml, using special delivery and transfer equipment referred to as diluters, droppers or micropipettes. Thus, each of the 28 regions may be processed using microtitrations in varying process conditions, or in similar processing conditions. For example, in a 28 region example, seven sets of processing conditions may be performed across four regions each. Each region may include any number of different or similar process conditions. After processing all regions, each region may then be characterized by one or more process techniques, by one or more process conditions, or by one or more process results.

As an example, a cleaning solution can be evaluated using combinatorial processing. The composition of several cleaning solutions can be varied across several regions of a substrate. Each of those solutions can be monitored and evaluated using the techniques described herein, and replenished using microtitration techniques as described above.

Other combinatorial processing may be performed in a manner that is not site isolated. For example, a wafer may be divided into many small coupons, any of which may be processed using different or similar conditions. In another example, a wafer may be processed using a gradient approach, where the processing varies over the substrate. Additionally dry processes (e.g., PVD, CVD) can be performed in a combinatorial fashion across a substrate, and combined with wet processes as described herein.

Figure 11:
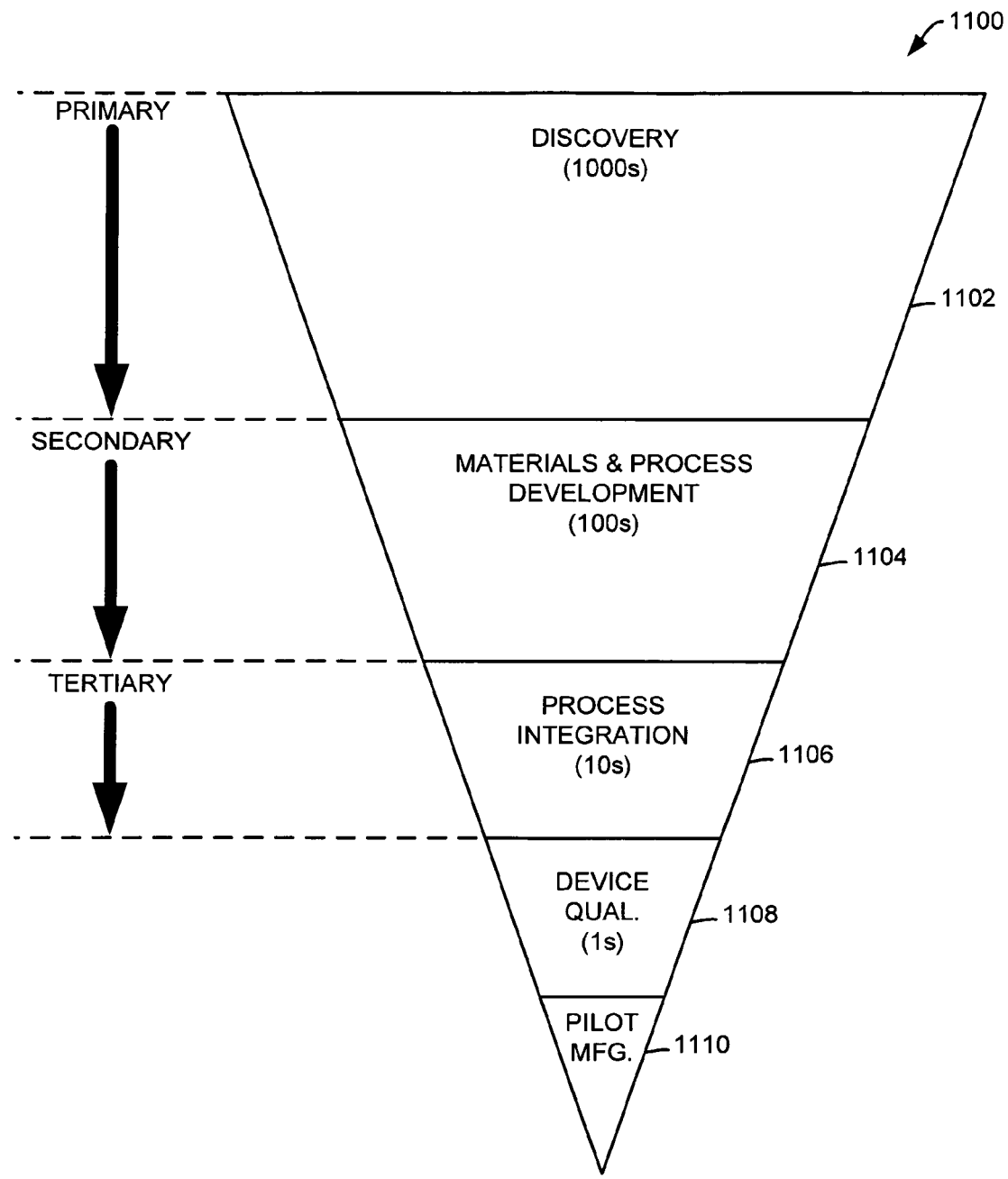
FIG. 11 is an illustrative schematic diagram for implementing combinatorial processing in accordance with embodiments of the present invention.

FIG. 11 is an illustrative schematic diagram 1100 for implementing combinatorial processing in accordance with embodiments of the present invention. Schematic diagram 1100 illustrates how the relative number of combinatorial processes associated with a group of substrates decreases as certain materials and/or processes are selected. Generally, combinatorial processing includes: performing a large number of processes during a first screening; selecting promising candidates from the first screening; performing the selected processing during a second screening; selecting promising candidates from the second screening; and so on. In addition, feedback from later stages to earlier stages may be utilized to refine the success criteria and provide better screening results.

For example, thousands (1000s) of materials or processes may be evaluated during a discovery stage 1102. Discovery stage 1102 is also known as a primary screening stage performed using primary screening techniques. Primary screening techniques may include dividing wafers into coupons and depositing materials or performing processes using various processes under various conditions. The materials or processes may then be evaluated, whereupon promising candidates may be advanced to a materials and process development stage 1104 also know as a secondary screening stage. Evaluation of materials or processes may be performed using metrology tools such as electronic testers and imaging tools (i.e., microscopes). Materials and process development stage 1104 may evaluate hundreds (100s) of materials selected from the materials discovery 1102 stage. Techniques at this stage may focus on processes used to deposit, develop, or clean selected materials. Promising candidates may then be advanced to a process integration stage 1106 also known as a tertiary screening stage. Process integration stage 1106 may evaluate tens (10s) of materials and/or processes and combinations selected from the materials and process development stage 1104. Techniques at this stage may focus on integrating selected processes and materials with additional processes and materials.

The most promising candidates from process integration stage 1106 are advanced to device qualification stage 1108. In device qualification stage 1108, selected materials and processes are evaluated for high volume manufacturing or processing, which is typically conducted on full wafers within production tools, but need not be conducted in such a manner. The results are evaluated to determine the efficacy of the selected materials and processes. Successful candidates may then proceed to pilot manufacturing stage 1110.

Schematic diagram 1100 demonstrates methods by which various techniques may be utilized to evaluate selected materials and processes for the development of semiconductor devices using methods of monitoring and controlling combinatorial process described here. It may be appreciated that the designated nomenclature for the various stages 1102-1110 described above are for clarity in understanding embodiments described herein and should not be construed as limiting. In addition, in some embodiments, stages may overlap, occur out of sequence, be described, and be performed in any number of manners without limitation. As an example, cleaning processes may be evaluated at any stage of the combinatorial processing sequence. Cleaning processes may be evaluated in isolation, for example, using only a single stage, or may proceed through two or more stages. For example, certain cleaning processes showing advantageous characteristic during a primary stage may be advanced to a secondary stage where fewer formulations are evaluated but more characterization of each formulation is performed. In this example, evaluation of cleaning formulations may begin at the development stage 1104.

While this invention has been described in terms of several embodiments, there are alterations, permutations, and equivalents, which fall within the scope of this invention. It should also be noted that there are many alternative ways of implementing the methods and apparatuses of the present invention. Furthermore, unless explicitly stated, any method embodiments described herein are not constrained to a particular order or sequence. Further, the Abstract is provided herein for convenience and should not be employed to construe or limit the overall invention, which is expressed in the claims. It is therefore intended that the following appended claims be interpreted as including all such alterations, permutations, and equivalents as fall within the true spirit and scope of the present invention.

What is claimed is:

1. A method for monitoring and controlling a combinatorial process, the method comprising:
   receiving a substrate;
   executing the combinatorial process, wherein the combinatorial process includes at least one in-line chemical preparation;
   analyzing the at least one in-line chemical preparation using an acid-base titration analysis for conformance with a corresponding in-line chemical preparation parameter; and
   adjusting the at least one in-line chemical preparation to conform with the corresponding in-line chemical preparation parameter utilizing at least one replenishing chemical preparation if any of the at least one in-line chemical preparation is out of conformance with the corresponding in-line chemical preparation parameter.

2. The method of claim 1, further comprising:
   performing a post-chemical mechanical planarization (CMP) clean before executing the combinatorial process, wherein the combinatorial process is a pre-clean; and
   depositing a capping layer after the pre-clean.

3. The method of claim 1, wherein analyzing the at least one in-line chemical preparation using an acid-base titration analysis comprises:

creating a plurality of calibration curves of pH as a function of titrant volume for a first component of the at least one in-line chemical preparation, wherein the plurality of calibration curves represent selected concentrations of the first component of the at least one in-line chemical preparation;

creating a buffer zone calibration curve of a calibration pH buffer zone width as a function of the selected concentrations of the first component, the calibration pH buffer zone width derived from the plurality of calibration curves;

plotting a titration curve of the at least one in-line chemical preparation, the titration curve including a plotted pH buffer zone width;

determining a concentration of the first component by comparison of the plotted pH buffer zone width with the calibration pH buffer zone width;

creating an internal reference curve of pH as a function of concentration of a second component to determine an approximate endpoint for a reverse acid titration;

determining the approximate endpoint from the titration curve of the at least one in-line chemical preparation, wherein the titration curve includes a sloppy tail region, wherein the sloppy tail region is characterized by a slope, and wherein the approximate endpoint is located where the slope approaches zero; and determining the in-line concentration of the second component by finding an actual endpoint from the internal reference curve, wherein the actual endpoint locates at a point where pH is solely determined by the second component.

4. The method of claim 1, further comprising:
before the executing the combinatorial process, analyzing the at least one replenishing chemical preparation using an replenishing chemical analysis for conformance with a corresponding replenishing parameter, the at least one replenishing chemical preparation configured for the adjusting the at least one in-line chemical preparation; and if the at least one replenishing chemical preparation is out of conformance with the corresponding replenishing chemical preparation parameter, adjusting the at least one replenishing chemical preparation to conform with the specified replenishing chemical preparation parameter.

5. The method of claim 4, further comprising:
before the executing the combinatorial process, pre-analyzing the at least one in-line chemical preparation for conformance to the specified in-line parameter; and if the at least one in-line chemical preparation is out of conformance with the specified in-line chemical preparation parameter, adjusting the at least one in-line chemical preparation to conform with the specified in-line chemical preparation parameter utilizing the at least one replenishing chemical preparation.

6. The method of claim 3, wherein determining the concentration of the first component comprises determining the concentration of a weak acid selected from the group consisting of: succinic acid, acetic acid, uric acid, glycolic acid, and ethylenediaminetetraacetic acid (EDTA.)

7. The method of claim 1, wherein analyzing the at least one in-line chemical preparation further comprises using a combination high-performance liquid chromatography (HPLC) separation and a ultraviolet (UV) spectroscopy analysis.

8. The method of claim 1, wherein the at least one in-line chemical preparation is an aqueous solution comprising:
an alkyl-alcohol amine portion having a first concentration in the range of approximately 0.05 to 2.0 M;
an ascorbic acid portion having a second concentration in the range of approximately 0.03 to 0.30 M; and
a tetramethylammonium hydroxide (TMAM portion having a third concentration in the range of approximately 0.05 to 1.5 M.

9. The method of claim 3, wherein determining the in-line concentration of a second component comprises determining a concentration of ascorbic acid using the sloppy tail region of the titration curve.

10. The method of claim 1, wherein analyzing the at least one in-line chemical preparation further comprises using a combination solution pH and electrical conductance analysis.

11. The method of claim 1, wherein analyzing the at least one in-line chemical preparation further comprises using a visible spectroscopy analysis.

* * * * *